United States Patent [19]
Baylac et al.

[11] 3,967,208
[45] June 29, 1976

[54] AMPLIFYING INTEGRATED CIRCUIT IN THE MOS TECHNOLOGY

[75] Inventors: Bernard Baylac; Gérard Merckel, both of Sassenage; Pierre Meunier, Puteaux, all of France

[73] Assignee: Commissariat a l'Energie Atomique, Paris, France

[22] Filed: Jan. 16, 1975

[21] Appl. No.: 541,568

[30] Foreign Application Priority Data
Jan. 25, 1974 France .............................. 74.02589

[52] U.S. Cl. .................................. 330/35; 330/28; 330/38 M
[51] Int. Cl.² .......................................... H03F 3/16
[58] Field of Search .................... 330/28, 35, 38 M; 307/304

[56] References Cited
UNITED STATES PATENTS

| | | | |
|---|---|---|---|
| 3,265,981 | 8/1966 | Dill | 330/35 X |
| 3,405,368 | 10/1968 | Howe | 330/35 X |
| 3,516,004 | 6/1970 | Burns | 330/35 X |
| 3,747,064 | 7/1973 | Thompson | 307/304 X |

FOREIGN PATENTS OR APPLICATIONS
1,239,213   7/1971   United Kingdom .............. 330/30 D

*Primary Examiner*—James B. Mullins
*Attorney, Agent, or Firm*—Cameron, Kerkam, Sutton, Stowell & Stowell

[57] ABSTRACT

A negative-feedback band-pass amplifier constructed in accordance with the MOS technology comprises an input stage of the summing amplifier type constituted by two MOS transistors having sources connected to each other and to ground and drains connected to each other. The gate of one transistor constitutes the amplifier input and the gate of the other transistor is connected to the amplifier output through the negative feedback resistance. An amplifying chain whose input is coupled with the common drain connection of the input stage and whose output constitutes the amplifier output comprises $n$ identical stages in series. Each stage is of the inverting amplifier type constituted by an MOS transistor mounted with a common source connected to ground and an MOS transistor mounted as a load resistance.

2 Claims, 7 Drawing Figures

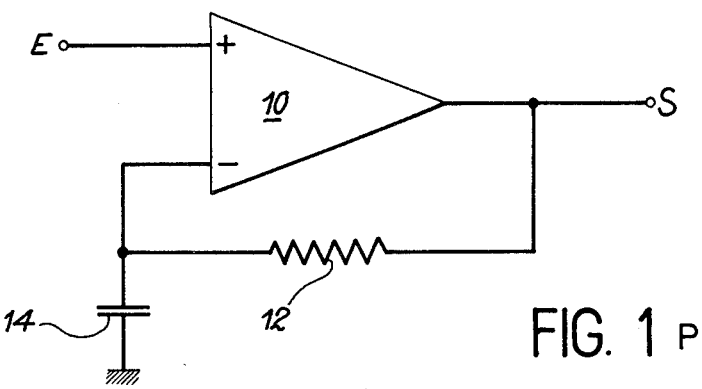
FIG. 1 PRIOR ART
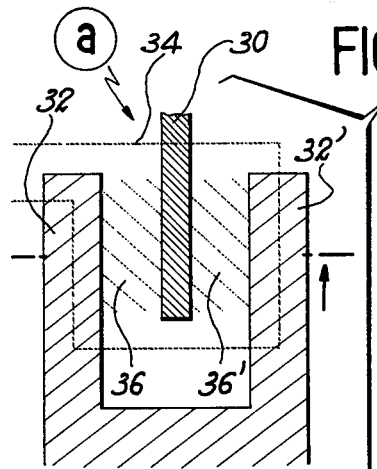
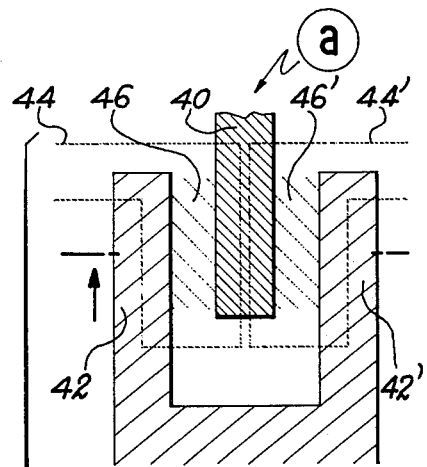
FIG. 3
FIG. 4

AMPLIFYING INTEGRATED CIRCUIT IN THE MOS TECHNOLOGY

This invention relates to an amplifying integrated circuit constructed in accordance with the MOS technology and is applicable in the field of electronics to the amplification of fast pulses of very low amplitude. The circuit according to the invention can be employed especially in the construction of a measuring channel for a wire-type proportional chamber.

Amplifiers comprising bipolar transistors of the band-pass and negative feedback type are well known. These circuits are capable of high operating speeds but suffer from the disadvantage of being more difficult to construct when they form part of a complex integrated circuit as well as having a higher power consumption.

This invention is precisely directed to an amplifier which is not subject to these disadvantages. The amplifier which is contemplated by the invention is constructed in accordance with the MOS technology although this latter is intrinsically slower than the bipolar technology; by virtue of an original design concept of the circuits, the amplifier in accordance with the invention exhibits low dispersion of the operating speed and in the offset voltages.

The input stage of a conventional amplifier of the bipolar transistor type consists of a differential stage followed by amplifying stages which are also of the differential type as a general rule. If an amplifier of this type were simply transposed to the MOS technology, the overall size, power consumption and cost resulting from the presence of these differential stages would be prohibitive.

If the succession of differential amplifying stages of the conventional bipolar amplifier were alone replaced by a series of stages of the MOS-transistor inverting-amplifier type, ths would further result in difficulties arising from differences and drift of the continuous levels which vary to a very different extent in the inverting-amplifier stages and in the differential input stage which would not in such a case have the same character.

On the contrary and in accordance with an essential feature of the invention, the amplifier is constituted by a series of stages of identical structure including the input stage. With this objective, the input differential stage of the conventional amplifier is replaced by a summing-amplifier stage having two identical MOS transistors and the conventional differential amplifying stages are replaced by inverting-amplifier stages formed by MOS transistors which are identical with each other and similar to the transistor employed in the input stage.

In more exact terms, the present invention has for its object a negative-feedback band-pass amplifier constructed in accordance with the MOS technology and essentially comprising:

an input stage of the summing amplifier type constituted by two MOS transistors whose sources are connected to each other and to ground and whose drains are connected to each other, the gate of one of said two transistors being such as to constitute the amplifier input whilst the gate of the other transistor is connected to the amplifier output through the negative feedback resistance, an amplifying chain whose input is coupled with the common drain connection of the input stage and whose output constitutes the amplifier output, said chain being such as to comprise $n$ identical stages in series where $n$ is even-numbered, each stage being of the inverting amplifier type constituted by an MOS transistor mounted with a common source connected to ground and an MOS transistor mounted as a load resistance.

In an advantageous embodiment, all the MOS transistors of the amplifying chain are interdigitized or in other words constituted by two MOS transistors having identical geometries mounted in parallel and having the same drain, the doped source regions being connected to each other and the gates of said transistors being connected to each other.

In another embodiment which is advantageously combined with the preceding, the two MOS transistors constituting the input stage have the same geometries and have the same doped drain region, the doped source regions of said transistors being connected together and their gates being identical but separated from each other.

The use of interdigitized MOS transistors and of parallel-connected transistors which are identical in the input stage results in the fact that, even if the stray capacitances which govern the speed of operation of each MOS transistor are different from one transistor to the other by reason of the dissymmetries of positioning of the masks at the moment of fabrication of the transistors, an interdigitized MOS transistor achieves a mean value between the speeds which are characteristic of the two transistors constituting said MOS transistor and said mean value remains substantially equivalent in the case of the different interdigitized transistors of any one substrate (even at a substantial distance) or of different substrates. The amplifier according to the invention thus has low dispersions in its speed of operation.

The properties and advantages of the invention will in any case become more readily apparent from the following description of examples of construction which are given by way of explanation without any limitation being implied, reference being made to the accompanying drawings, in which:

FIG. 1 illustrates a conventional amplifier of the band-pass and negative feedback type;

FIG. 3 is a top view (FIG. 3a) and a sectional view (FIG. 3b) of the structure of an interdigitized MOS transistor employed in an inverter stage;

FIG. 4 is a top view (FIG. 4a) and a sectional view (FIG. 4b) of the structure of an MOS transistor employed in the input summing stage;

There is shown in FIG. 1 a conventional band-pass, negative feedback amplifier. This circuit comprises in known manner a differential amplifier 10 having a gain $G_0$, the positive input of which is connected to the input E of the circuit and the output S of which is closed on the negative input of the amplifier by means of a negative feedback resistor 12 having a value R, and in which said negative input is connected to ground through a capacitor 14 having a value C. It is known that, if $G_0$ is considerably higher than 1, the gain of said amplifier is substantially equal to:

$$G = \frac{1 + j\omega\tau}{1 + j\omega\tau/G_0}$$

where $\tau = RC$ and where $\omega$ is the angular frequency and $j = \sqrt{-1}$.

Figure 2:
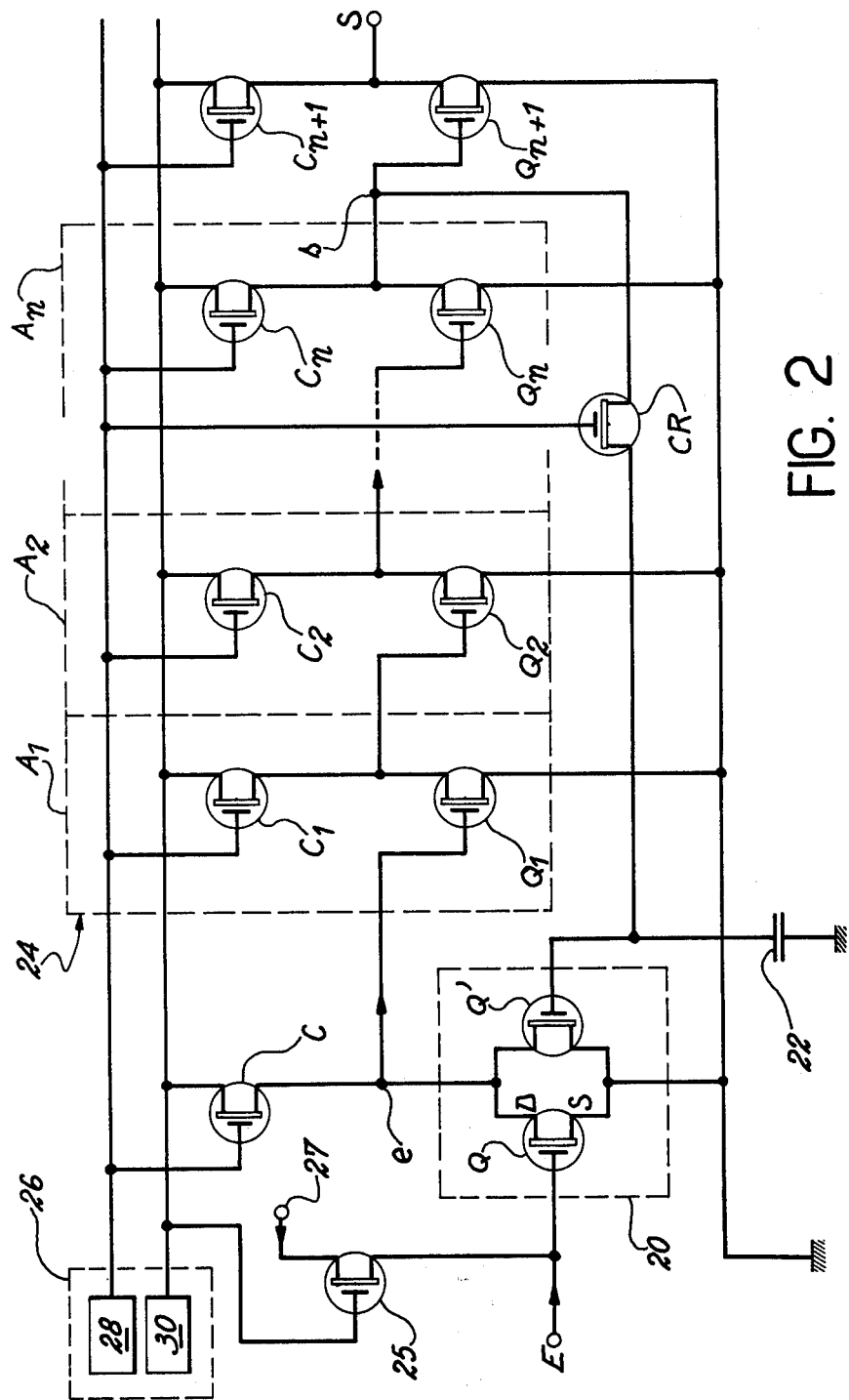
FIG. 2 illustrates the amplifying circuit according to the invention.

The amplifier in accordance with the invention is based on this conventional circuit and is represented schematically in FIG. 2. Said amplifier comprises an input stage 20, an amplifying chain 24 and a polarizing supply 26.

The input stage 20 is of the summing-amplifier type and is constituted by two MOS transistors Q and Q', the sources of which are connected to each other and connected to ground and the drains of which are connected to each other; the gate of the transistor Q corresponds to the input E of the amplifier and the gate of the transistor Q' is connected on the one hand to the output s of the amplifier by means of a transistor CR mounted as a negative feedback resistance and on the other hand to ground through a capacitor 22.

The input e of the amplifying chain 24 is connected to the drains of the transistors Q and Q'. Said chain comprises n identical stages connected in series and designated by the references $A_1, A_2 \ldots A_n$; a stage of the order i is of the inverting-amplifier type and comprises an MOS transistor mounted with a common source connected to ground as designated by the reference $Q_i$.

The polarizing supply 26 is connected to the drain of the transistors Q, Q', $Q_1, Q_2 \ldots Q_n$ through load transistors C, $C_1, C_2 \ldots C_n$ respectively. Said polarizing supply 26 comprises a very-high-voltage source 28 and a high-voltage source 30; the source 28 is connected to the gates of the load transistors and the high-voltage source 30 is connected to the drains of said load transistors. The value of the very high voltage is usually close to the value of the high voltage increased by the threshold voltage of the load transistors.

The circuit of FIG. 2 is completed by a final stage having the index $n+1$ and constituted by a final inverting transistor $Q_{n+1}$ associated with a load transistor $C_{n+1}$. The final output of the circuit is designated by the reference S.

The MOS transistor 25 serves to adjust the continuous level and is controlled by the connection 27.

The negative feedback resistance CR is practically insensitive to variations in threshold voltage and can have a value in the vicinity of 200 kilohms. The precision required for the capacitor 22 located outside the circuit is not critical. This capacitor can be added to the integrated circuit by hybridization.

As mentioned earlier, the differential input stage which is provided in conventional amplifiers has been replaced in the amplifier according to the invention by the summing stage 20, thereby reducing the overall size, power consumption and cost.

In regard to the differential stages of the amplifying chain, said stages have been replaced by inverting stages. In point of fact, by virtue of the technique of interdigitized MOS transistors, it is possible to employ very similar configurations in the case of the transistors of the circuit 20 and in the case of the transistors $Q_1, Q_2 \ldots Q_n$ of the amplifying chain. These configurations are shown in FIGS. 3 and 4.

FIG. 3 shows the structure of the interdigitized MOS transistors which are intended to be mounted in the inverting stages of the amplifying chain 24 (transistors $Q_1, Q_2 \ldots Q_n$). FIG. 3a is a top view of a transistor and FIG. 3b is a sectional view of said transistor. From these figures, it is seen that each transistor of the inverting stages is constituted by two MOS transistors in parallel having the same drain 30 and two source diffusions 32 and 32' which are joined together. The single spray-deposit 34 defines two channels 36 and 36' each having a width $Z_a$ and a length $L_a$. The insulating layer is designated by the reference 35. Since the principal characteristics of the two transistors which form said inverting transistor are identical, both transistors carry equal currents. Should the stray capacitances be different from one transistor to the other as a result of relative displacement between the masks employed in the respective formation of gate diffusions and metallic deposits, the speed of operation of the interdigitized transistor is the mean value of the speeds of each of the two constituent transistors and this mean value remains substantially the same in the case of the different interdigitized MOS transistors which constitute the amplifying chain 24.

This technique of the interdigitized transistor can also be applied to the summing stage 20 in order to ensure that this latter has a configuration which is as close as possible to that of the amplifying chain, thus achieving a further reduction in the overall dispersion which may affect the speed of operation. The structure of the transistors constituting the summing stage is shown in FIG. 4. This integrated circuit comprises two transistors having the same configuration and connected in parallel. They have the same drain 40, source diffusions 42 and 42' which are connected to each other and metallic deposits 44 and 44' which are identical but separated from each other. The channels of the two transistors 46 and 46' have a width $Z_e$ and a length $L_e$.

In order to match the two circuits of FIGS. 3 and 4, it is an advantage to fabricate transistors in which the characteristic ratio $Z_a/L_a$ of a transistor of the amplifying chain has twice the value of the characteristic ratio $Z_e/L_e$ of a transistor of the input stage.

The present Applicant has established the fact that the amplifier according to the invention in which the number of stages is not limitative permits amplification of pulses having an amplitude below 0.5 mV, the bottom limit being the noise of the transistors of the order of 0.1 to 0.2 mV and the dispersion of the threshold voltages. In the case of a gain of the order of $10^3$, the thermal drift related to the input is of the order of 2 $\mu$V/°C. The so-called offset voltage related to the input is lower than 0.5 mV. The input impedance fixed by the transistor which is connected to the bias voltage is 4 kilohms. This continuous-connection amplifier makes it possible to amplify pulses of any polarity. The dynamic range of adjustment of the continuous level is very flexible.

In the case of masks having a degree of inaccuracy which does not exceed 0.5 $\mu$ and in the case of small overetching dispersions of the order of 0.3 $\mu$, the circuit of the invention as described in the foregoing is insensitive to relative displacement of the masks which is liable to attain 2 $\mu$.

The design concept and characteristics of the amplifier which has just been described make it particularly suitable in a measuring channel for processing pulses derived from a wire-type proportional chamber. It is known that, in very general terms, a chamber of this type comprises a plurality of crossed conductive wires in which charges are induced by the charged particles which pass in the vicinity of the wires.

Figure 5:
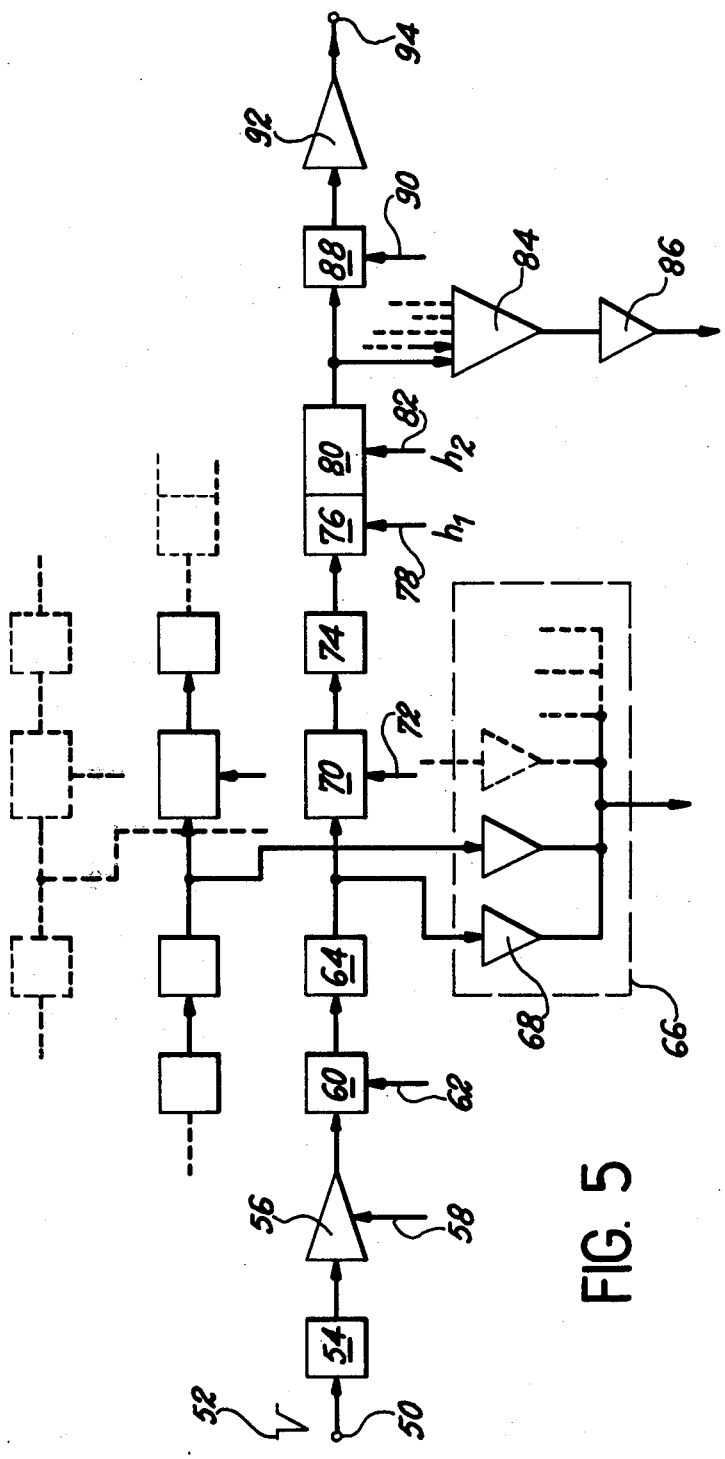
FIG. 5 illustrates one example of application of the amplifier according to the invention to the formation of a measuring channel for a wire-type proportional chamber.

A measuring channel of this type which makes use of the amplifier in accordance with the invention is shown diagrammatically in FIG. 5. The voltage pulse 52 which appears at the extremity of one of the wires (not shown) is applied to the input 50. The circuit 54 is a circuit for protection and adjustment of the input impedance. The circuit 56 is the amplifier in accordance with the invention with its connection 58 for adjusting the continuous level, which corresponds to the connection 27 of the circuit shown in FIG. 2. The circuit 60 is a variable-threshold trigger circuit provided with a connection 62 for adjusting the threshold value. The circuit 64 is a shaping circuit with differentiation on a signal front having a definite direction. The circuit 66 comprises eight matching circuits 68, the outputs of which form an OR-type wired logic circuit, the signals derived from eight parallel channels associated with eight wires of the chamber being applied to the circuit 66. Said eight measuring channels are integrated on a single chip and this results in a single eight-channel unit. The circuit 70 is a monostable circuit whose time-duration can be varied by means of the connection 72. The circuit 74 is a shaping circuit with differentiation of a signal front of definite direction and is similar to the circuit 64. The circuit 76 is an AND-type logical gate providing coincidence between the signal applied thereto and an external drive $h_1$ applied to the connection 78. The reference 80 designates a storage device with possible resetting to zero controlled by the connection 82 to which a signal $h_2$ is applied. The circuit 84 is a NOR-type logic circuit having eight inputs connected to the eight measuring channels of the single chip on which said eight channels are integrated. Said circuit 84 controls a matching circuit 86 which is similar to the matching circuits 68 but has an output of lower speed. The circuit 88 is an AND-type logical gate providing coincidence between the information derived from the circuit 80 and a drive signal which appears on the connection 90. The circuit 92 is a matching circuit which is similar to the matching circuits 68. The output of the measuring and processing channel is designated by the reference 94.

The operation of said channel is briefly as follows. In the same manner as the seven other channels of the unit, the channel shown is connected to one wire of the proportional chamber. A signal which appears on this wire is amplified, calibrated in amplitude and in time-duration by the circuit 64 and the pulse collected at the output of the circuit 66 warns the external computer of an event at the level of one of the eight channels. If this event is considered by the computer to be of interest, said computer produces a control signal for the gate 76 at the end of a predetermined time interval. The time-delay introduced by the computer is known and taken into account by the monostable circuit 70. If the delayed pulse at the output of the circuit 74 coincides with the activation of the gate 76, the information is stored in a memory device in the channel which has collected the signal and the output of the matching circuit 86 warns the computer that the event has effectively been stored in one or a number of memory devices. Finally, the signal which controls the gate 88 makes it possible to locate the memory device which stores the information and therefore the wire in which the event has taken place. Once the wire has been located, the memory device is reset to zero by a signal applied to the connection 82 and the channel is available for the following event. The outputs of the circuits 66 and 86 permit the construction of direct wired OR-circuits between a large number of eight-channel units without entailing the need for an additional external logical function.

What we claim is:

1. A negative-feedback band-pass amplifier constructed in accordance with the MOS technology, wherein said amplifier comprises:

an input stage of the summing amplifier type constituted by two MOS transistors each having a doped drain region, a doped source region and a gate, wherein said two MOS transistors have the same geometries and have the same doped drain region, the doped source regions of said transistors being connected together and to ground and their gates being identical but separated from each other, the gate of one of said two transistors being such as to constitute the amplifier input while the gate of the other transistor is connected to the amplifier output, a negative feedback resistance connected between said amplifier output and said gate of said other transistor, an amplifying chain whose input is connected to said same doped drain region of the input stage and whose output constitutes the amplifier output, said chain being such as to comprise $n$ identical stages in series where $n$ is even-numbered, each stage being of the inverting amplifier type constituted by a MOS transistor mounted with a common source connected to ground and a MOS transistor mounted as a load resistance, wherein all the MOS transistors of said chain are interdigitized and constituted by two MOS transistors having identical geometries mounted in parallel and having the same drain, the doped source regions being connected to each other and the gates of said transistors being connected to each other.

2. An amplifier according to claim 1, wherein the ratio $Z_a/L_a$ of the width $Z_a$ to the length $L_a$ of the channel in the case of the transistors of the amplifying chain has twice the value of the raio $Z_e/L_e$ of the width $Z_e$ to the length $L_e$ of the channel of a transistor of the input stage.

* * * * *